(12) United States Patent
Greshishchev et al.

(10) Patent No.: US 12,224,783 B2
(45) Date of Patent: Feb. 11, 2025

(54) BROADBAND ACTIVE COUPLING METHOD AND DEVICE

(71) Applicant: Ciena Corporation, Hanover, MD (US)

(72) Inventors: Yuriy Greshishchev, Ottawa (CA); Aravinthan Vigneswaran, Ottawa (CA)

(73) Assignee: Ciena Corporation, Hanover, MD (US)

( * ) Notice: Subject to any disclaimer, the term of this patent is extended or adjusted under 35 U.S.C. 154(b) by 552 days.

(21) Appl. No.: 17/586,906

(22) Filed: Jan. 28, 2022

(65) Prior Publication Data
US 2023/0246660 A1  Aug. 3, 2023

(51) Int. Cl.
| | | |
|---|---|---|
| *H04B 1/04* | (2006.01) | |
| *H03F 1/26* | (2006.01) | |
| *H03F 3/195* | (2006.01) | |
| *H04B 1/18* | (2006.01) | |

(52) U.S. Cl.
CPC .......... *H04B 1/0483* (2013.01); *H03F 1/26* (2013.01); *H03F 3/195* (2013.01); *H04B 1/18* (2013.01); *H03F 2200/294* (2013.01); *H03F 2200/451* (2013.01); *H04B 2001/0491* (2013.01)

(58) Field of Classification Search
CPC .......... H04B 1/0483; H04B 1/18; H03F 1/26; H03F 3/195
See application file for complete search history.

(56) References Cited

U.S. PATENT DOCUMENTS

| | | | | |
|---|---|---|---|---|
| 5,551,075 | A * | 8/1996 | Caux ........................ | H04B 1/18 455/317 |
| 10,135,339 | B1 * | 11/2018 | Rosenbaum ............ | H03F 3/245 |
| 10,284,358 | B1 * | 5/2019 | Dhalla ..................... | H04L 7/08 |
| 10,305,517 | B1 * | 5/2019 | Gathman ................ | H04B 1/18 |
| 2015/0235941 | A1 * | 8/2015 | Nishijima ............... | H03F 3/195 257/532 |
| 2017/0310290 | A1 * | 10/2017 | Splithof .................... | H03F 1/26 |
| 2019/0056544 | A1 * | 2/2019 | Bahabad ................ | G02B 5/203 |
| 2023/0216486 | A1 * | 7/2023 | Zhou ....................... | H03H 11/04 |

* cited by examiner

*Primary Examiner* — David Bilodeau
(74) *Attorney, Agent, or Firm* — Young Basile Hanlon & MacFarlane, P.C.

(57) ABSTRACT

Described are broadband active coupling circuits and methods. A broadband active coupling circuit includes a high-pass circuit configured to provide a high frequency response for a broadband signal and a low-pass circuit connected in parallel with the high-pass circuit. The low-pass circuit is configured to provide a low frequency response for the broadband signal, where the low-pass circuit includes an active circuit configured to minimally impact the high frequency response provided by the high-pass circuit.

20 Claims, 11 Drawing Sheets

BROADBAND ACTIVE COUPLING METHOD AND DEVICE

TECHNICAL FIELD

This disclosure relates to communications. More specifically, this disclosure relates to coupling or interfacing in an integrated circuit (IC) chip environment.

BACKGROUND

Communication systems can use transmitters and receivers (collectively "communication components or circuits") to transmit and receive signals across a transmission medium. These communication components can be implemented using a variety of IC chip technologies including, but not limited to, silicon complementary metal-oxide-semiconductor (CMOS), BiCMOS, and III-V material systems. Each of these technologies can use different operating voltages. As a result, a direct current (DC) output voltage level of a transmitter may not be compatible with a receiver input voltage level. A broadband alternating current (AC) coupling circuit or a broadband DC block circuit is therefore used to interface communication components fabricated from different IC chip technologies. This coupling circuit constructed using passive lumped or distributed resistor, inductor, capacitor, and transformer (RLCK) components. However, the broadband AC coupling circuits limit the signal transmission at frequencies approaching DC. This impacts the use of optical communication systems which have frequency bandwidth requirements from at or near DC (zero hertz) and up to more than hundreds of gigahertz. Consequently, interfacing broadband signals between communication components or circuits is very challenging.

SUMMARY

Described herein are broadband active coupling circuits and methods.

In implementations, a broadband active coupling circuit includes a high-pass circuit or channel configured to provide a high frequency response for a broadband signal and a low-pass circuit or channel connected in parallel with the high-pass channel. The low-pass channel is configured to provide a low frequency response for the broadband signal, where the low-pass channel includes an active circuit configured to minimally impact the high frequency response provided by the high-pass channel.

In implementations, a method for broadband active coupling includes passing, from a transmitter to a receiver via a high-pass channel, upper band frequencies of a broadband signal, the upper band frequencies starting from a first high-pass corner frequency up to higher frequencies and passing, from the transmitter to the receiver via a low-pass channel provided in parallel to the high-pass channel, lower band frequencies of the broadband signal, the lower band frequencies starting at or near the first high-pass corner frequency down to a second high-pass corner frequency, where the low-pass channel includes active components configured to isolate processing as between the low-pass channel and the high-pass channel.

In implementations, a system includes a transmitter circuit configured to transmit a broadband signal, a receiver circuit configured to receive the broadband signal via a transmission line, and a two-channel coupling circuit configured to interface between the transmitter circuit and the receiver circuit. The two-channel coupling circuit includes an upper band channel configured to pass frequencies from the broadband signal starting from an upper band corner frequency up to higher frequencies and a lower band channel connected in parallel to the upper band channel, the lower band channel configured to pass frequencies starting at or near the upper band corner frequency down to a lower band corner frequency. The lower band channel includes active circuitry configured to minimally impact passing of the frequencies by the upper band channel.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions, and methods. Those of ordinary skill may thus recognize that other elements and/or steps may be desirable or necessary to implement the devices, systems, compositions, and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

Figure 1:
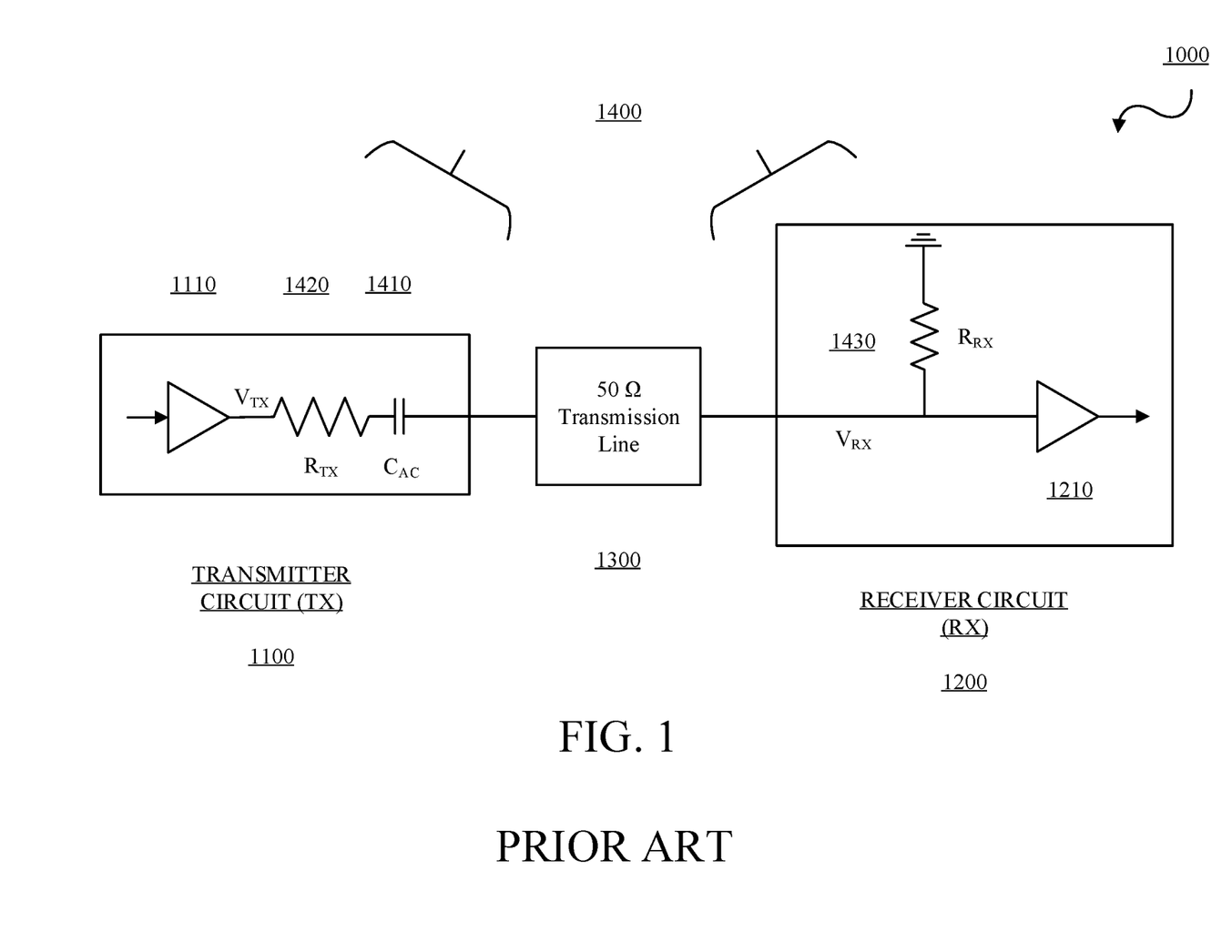
FIG. 1 is a block diagram of a system using a broadband AC coupling circuit.

FIG. 1 is a block diagram of a system 1000 using an AC coupling circuit. The system 1000 can include a transmitter component, board, or circuit (collectively "transmitter circuit" or "TX") 1100 connected to or in communication with (collectively "connected to") a receiver component, board, or circuit (collectively "receiver circuit" or "RX") 1200 via a transmission media 1300 such as a transmission line. The transmitter circuit 1100 can include a transmitter 1110 and the receiver circuit 1200 can include a receiver 1210. The broadband transmission media 1300 is implemented with characteristic impedance of 50 ohms ($\Omega$).

The transmitter circuit 1100 and the receiver circuit 1200 DC voltage levels must be matched. This is typically addressed using an AC coupling circuit 1400 which can include an AC coupling capacitor ($C_{AC}$) 1410. From a transfer function perspective, the AC coupling circuit 1400 includes series connection of the AC coupling capacitor ($C_{AC}$) 1410, the transmitter circuit resistor ($R_{TX}$) 1420, and a receiver circuit load resistor ($R_{RX}$) 1430. The resulting high-pass corner frequency ($F_{AC-HP}$) for the AC coupling circuit 1400 is then:

$$F_{AC-HP} = \frac{1}{2\pi R_{AC} C_{AC}}$$

where $R_{AC} = R_{TX} + R_{RX}$.

For optical communications, a required bandwidth ranges from a frequency $F_{AC-HP}$ of a few megahertz (MHz) to a low-pass bandwidth frequency ($F_{AC-LP}$) of more than hundreds of gigahertz (GHz). For example, the frequency range can be from 100 GHz down to 1 MHz. This represents a significant design issue because to meet the $F_{AC-LP}$ criteria, the resistance values of $R_{TX}$ and $R_{RX}$ are made to match the characteristic impedance value of the transmission media 1300. This means that $R_{TX}=50\Omega$ and $R_{RX}=50\Omega$, which results in $R_{AC}=100\Omega$. Such a low value for $R_{AC}$ yields impractical capacitance values for $C_{AC}$ with respect to modern IC technologies. For example, $C_{AC}$ would have to be 1.6 nF to achieve 1 MHz for $F_{AC-HP}$. This makes it nearly impossible to satisfy a $F_{AC-HP}$ of 1 MHz. More feasible capacitance values for $C_{AC}$ lead to minimum frequencies of two orders of magnitude higher, that is $F_{AC-HP} > 100$ MHz. Failure to meet very low $F_{AC-HP}$ negatively impacts an optical link budget Bit Error Rate (BER).

Described herein are circuits, devices, and methods to couple communication circuits using broadband active coupling circuits. The broadband active coupling circuits mitigate the minimum value constraints imposed on the $F_{AC-HP}$ by AC coupling circuits such as the AC coupling circuit 1400. This is achieved by adding a low-pass channel in parallel to a high-pass channel, as shown in FIG. 2A, where the high-pass channel passes frequencies from a first high-pass corner frequency ($F_{AC-HP1}$) to $F_{AC-LP}$ and the low-pass channel passes frequencies from or near $F_{AC-HP1}$ to a second high-pass corner frequency ($F_{AC-HP2}$). The responses from the high-pass channel and the low-pass channel can be combined at an output of a transmitter circuit to achieve an overall broadband frequency response as shown in FIG. 2B. In implementations, $F_{AC-HP2}$ can be at or near zero (0) hertz (Hz) while also passing frequencies up to, for example, $F_{AC-LP}$ of 100 GHz in the high-pass channel.

The low-pass channel is configured not to impact the response of the high-pass channel. This can be achieved by using an active circuit providing minimum interaction to the high-pass channel and at the same time limiting amplitude and phase variation in the low-pass channel up to the transition frequency between the high-pass channel and the low-pass channel. The low-pass channel can contain frequency filters that control the low-pass channel frequency and phase response and an overall TX-RX transfer function down to $F_{AC-HP2}$. The broadband active coupling circuit with two-channels can overcome $C_{AC}$ capacitor limitations and lower BER to meet the system requirements as described herein.

In implementations, the active circuit can be a transistor based (active) circuit with theoretically infinite input and output impedance. The active circuit can be implemented from, but not limited to, transistors, bipolar junction transistors (BJT) and metal-oxide-semiconductor field-effect transistor (MOSFETs). In implementations, the active circuit can be a voltage-to-current converter. In implementations, the low-pass channel can include a single-transistor circuit and a passive filter. This enables simple and power and area efficient on-chip implementation.

In implementations, the broadband active coupling circuits can be, but is not limited to, a single-ended broadband active coupling circuit, a differential broadband active coupling circuit, or a DC coupled differential broadband active coupling circuit. In the DC coupled differential broadband active coupling circuit, $F_{AC-HP2}$ can be zero (0) hertz.

The high-pass channel provides a frequency response in the hundreds of GHz range and follows the 50$\Omega$ matching requirements for the transmission media between the TX and RX components. The high-pass channel can be implemented as an on-chip radio frequency (RF) metal-insulator-metal (MIM) or metal-oxide-metal (MOM) capacitor with a value feasible for a given IC technology. For example, for a capacitor value of 10 pF, the high-pass channel can have a corresponding high-pass frequency corner $F_{AC\text{-}HP1}$ of ~159 MHz.

Figure 2:
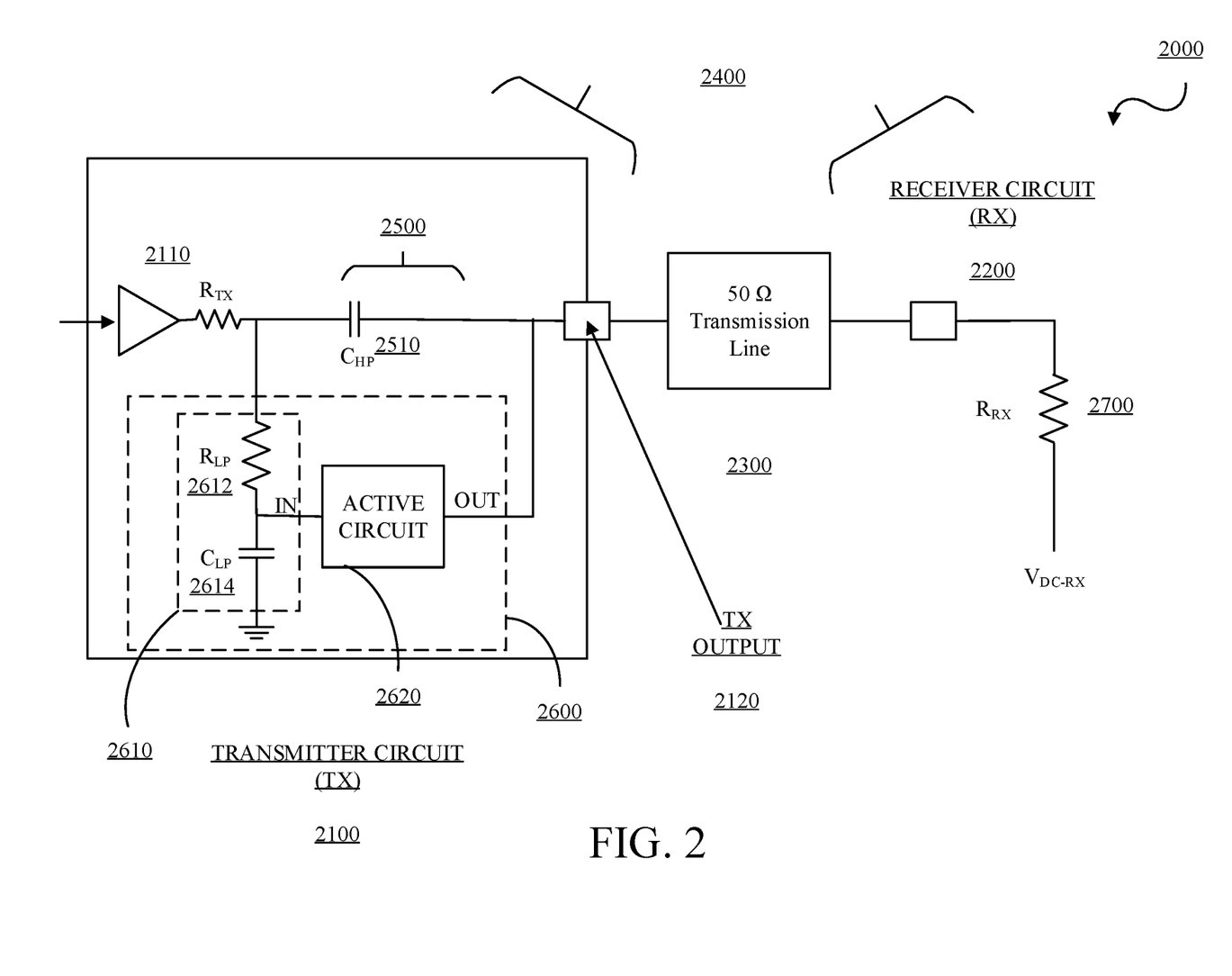
FIG. 2 is a block diagram of an example of a broadband active coupling circuit in accordance with embodiments of this disclosure.
Figure 2A:
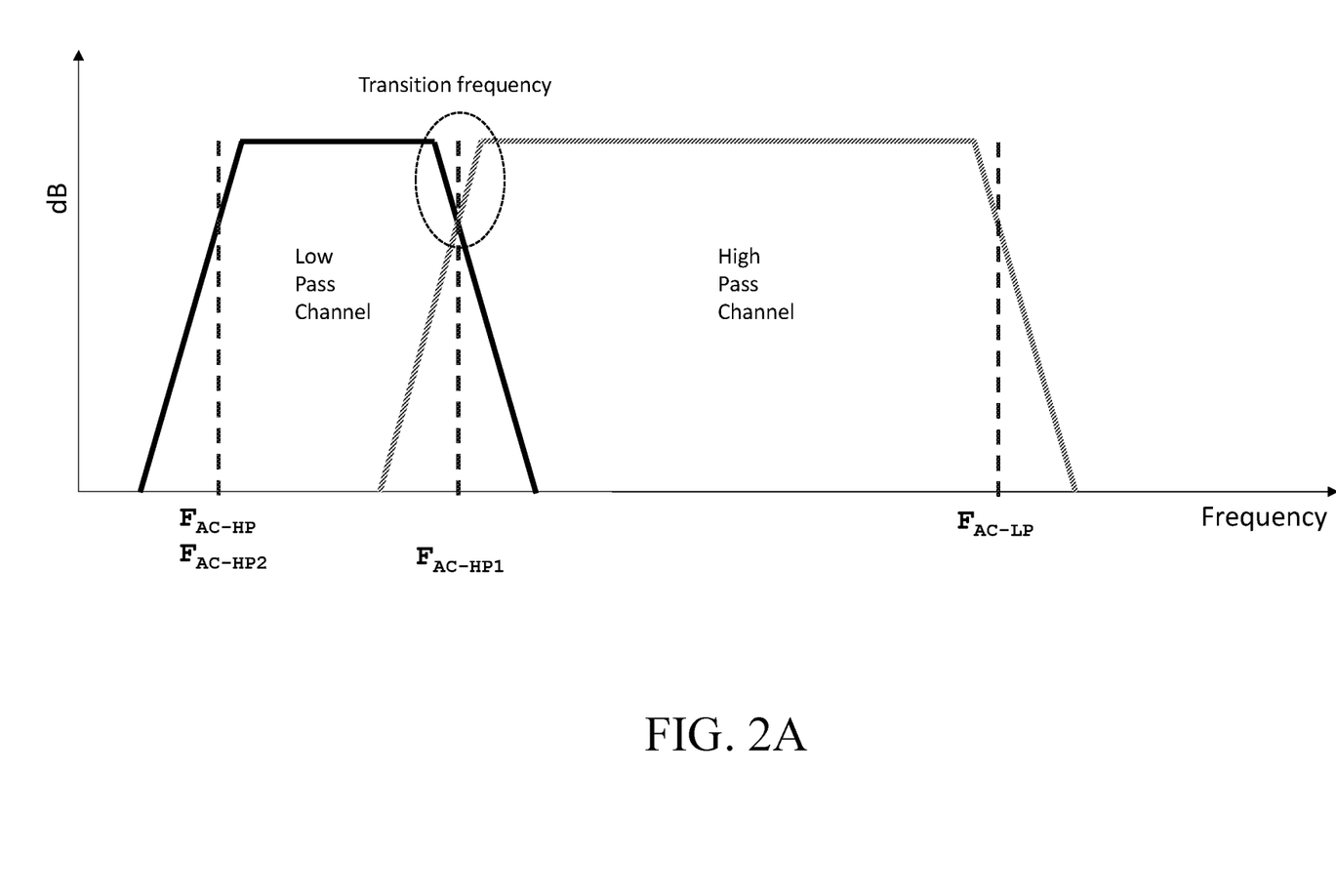
FIG. 2A is a graph of corner frequencies in a broadband AC coupling circuit in accordance with embodiments of this disclosure.
Figure 2B:
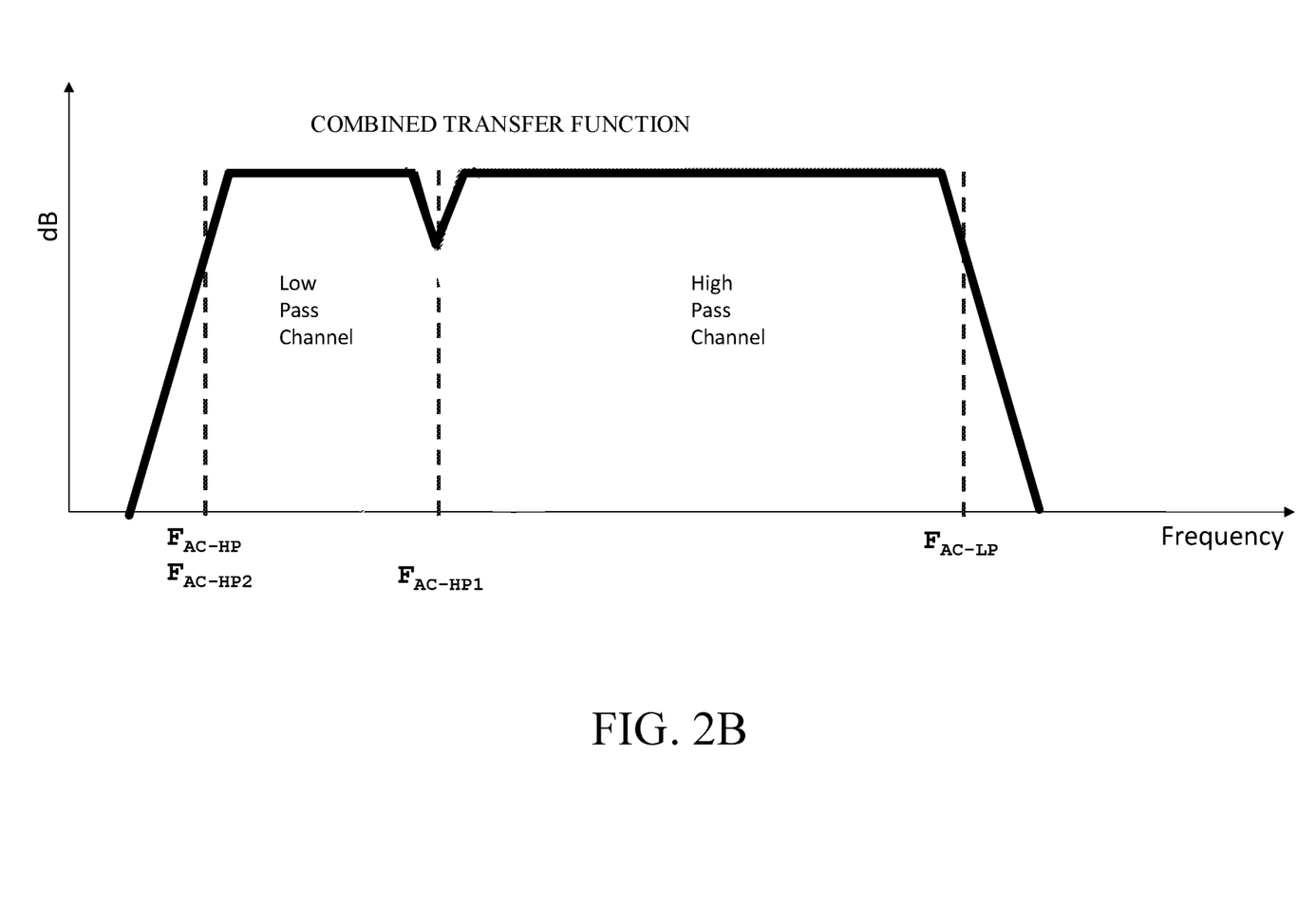
FIG. 2B is a graph of overall transfer function in accordance with embodiments of this disclosure.

FIG. 2 is a block diagram of an example of a system 2000. FIG. 2A is a graph of corner frequencies in a broadband AC coupling circuit in accordance with embodiments of this disclosure. The system 2000 includes a transmitter circuit 2100 connected to a receiver circuit 2200 via a transmission media 2300 and a broadband active coupling circuit 2400. The transmitter circuit 2100 can include a transmitter and/or driver 2110 which outputs a signal (e.g., a broadband signal), via a resister $R_{TX}$, as an input to the broadband active coupling circuit 2400, which in turn outputs a transmitter circuit output 2120 for transmission over the transmission media 2300 to the receiver circuit 2200. The transmission media 2300 has a characteristic impedance value of 50Ω, but could be other value suitable for interconnect implementation technology.

The broadband active coupling circuit 2400 can include a high-pass channel or circuit 2500 connected in parallel with a low-pass channel or circuit 2600. Both the high-pass circuit 2500 and the low-pass circuit 2600 are connected to the output of the transmitter 2110. The high-pass circuit 2500 can provide a high frequency transfer response and has a first high-pass corner frequency of $F_{AC\text{-}HP1}$. The high-pass circuit 2500 can pass frequencies from a $F_{AC\text{-}HP1}$ to $F_{AC\text{-}LP}$. The low-pass circuit 2600 can provide a low frequency transfer response and has a second high-pass corner frequency of $F_{AC\text{-}HP2}$. The low-pass circuit 2600 can pass frequencies at or near $F_{AC\text{-}HP1}$ down to $F_{AC\text{-}HP2}$. The outputs of the high-pass circuit 2500 and the low-pass circuit 2600 can be combined at the transmitter circuit output 2120.

The high-pass circuit 2500 can include a high-pass capacitor ($C_{HP}$) 2510 and a resistor $R_{TX}$ required for broadband matching of transmission line 2300 characteristic impedance. The value of $C_{HP}$ can be selected to match the constrains of a given IC technology without impacting interface performance. The low-pass circuit 2600 can include a low pass filter 2610 and an active circuit 2620. The low pass filter 2610 input is connected to the output of the transmitter 2110 via the resistor $R_{TX}$, while the low pass filter 2610 output is connected to an input of the active circuit 2620. The low pass filter 2610 can include a low-pass filter resistor ($R_{LP}$) 2612 and a low-pass capacitor ($C_{LP}$) 2614. The active circuit 2620 can be, but is not limited to, a transconductance circuit (which can have a representative transfer function of $G_M$) or a voltage-to-current converter.

From a transfer function perspective, the broadband active coupling circuit 2400 can include the high-pass circuit 2500, the low-pass circuit 2600, and a receiver circuit resistor ($R_{RX}$) 2700. The value of $R_{RX}$ is 50Ω.

Figure 3:
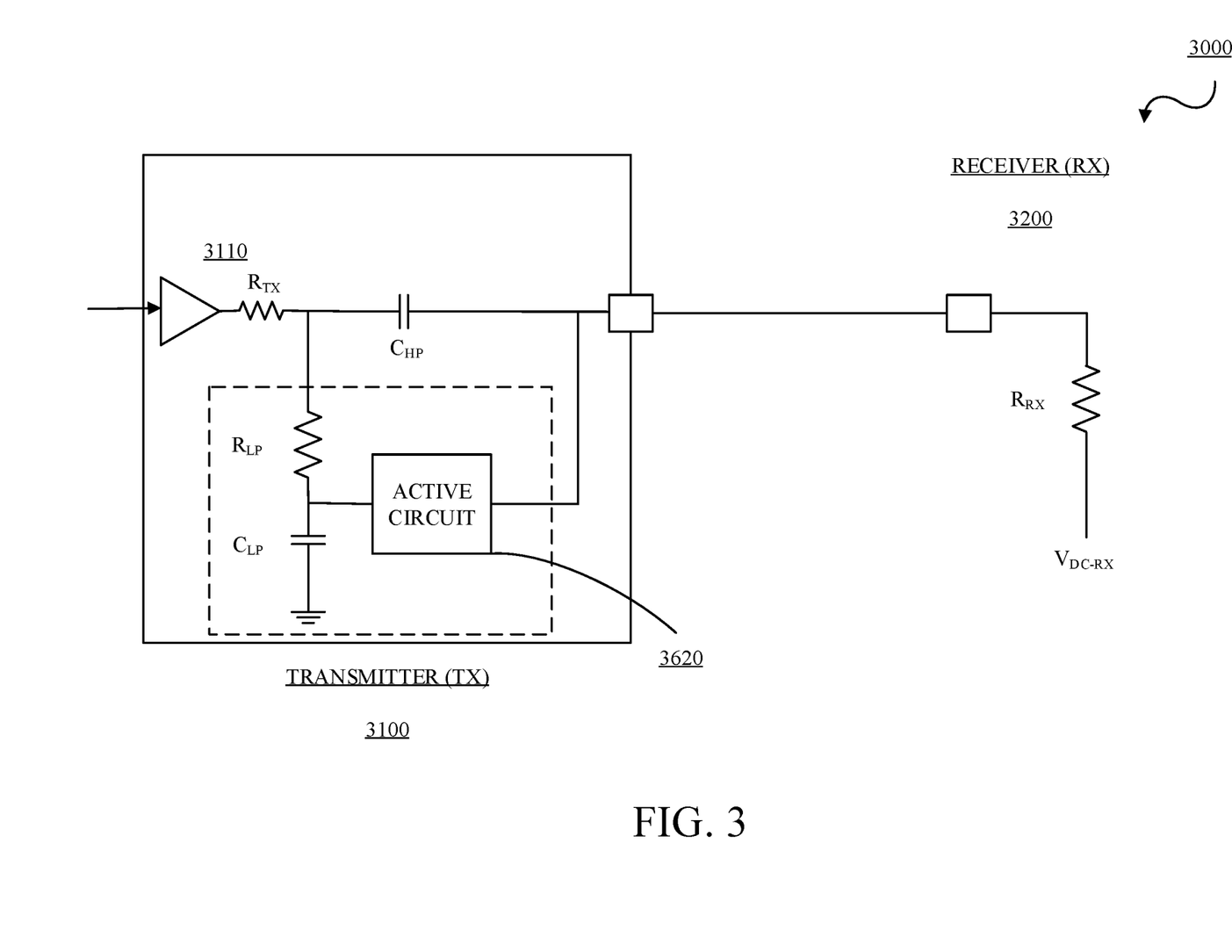
FIG. 3 is a block diagram of an example of an ideal broadband active coupling circuit in accordance with embodiments of this disclosure.

FIG. 3 is a block diagram of an example system 3000 which is an idealized version of the system 2000. Assume for simplicity, that a driver 3110 has zero output impedance, the resistor $R_{TX}$ has zero resistance, an active circuit 3620 has an ideal transfer function $G_M=1/R_{RX}$, and the active circuit 3620 has a high output impedance. Based on the above, a theoretical coupling transfer function is as follows:

$$f(s) = \frac{s \cdot \tau_{HP}}{1 + s \cdot \tau_{HP}} + \frac{G_M \cdot R_L}{(1 + s \cdot \tau_{LP})(1 + s \cdot \tau_{HP})}$$

where $\tau_{HP}$ and $\tau_{LP}$ are the RC time constants for the high-pass circuit 2500 and the low-pass circuit 2600, respectively. According to this formula, the high-pass corner frequency of combined circuit 2400 is equal to DC regardless of the $\tau_{HP}$ and $C_{HP}$ capacitance value. These values only determine the smoothness of the amplitude and phase response for the combined transfer function in the frequency transition area, as shown in FIGS. 2A and 2B. At the DC, the $f(s)(0)=G_M*R_L$, while at very high-frequencies $f(\infty)=1$. Making $G_M \cdot R_L=1$ will guarantee smooth amplitude response. Low ripple of the combined phase response can also be provided by proper selection of the $\tau_{HP}$ and $\tau_{LP}$.

Figure 4:
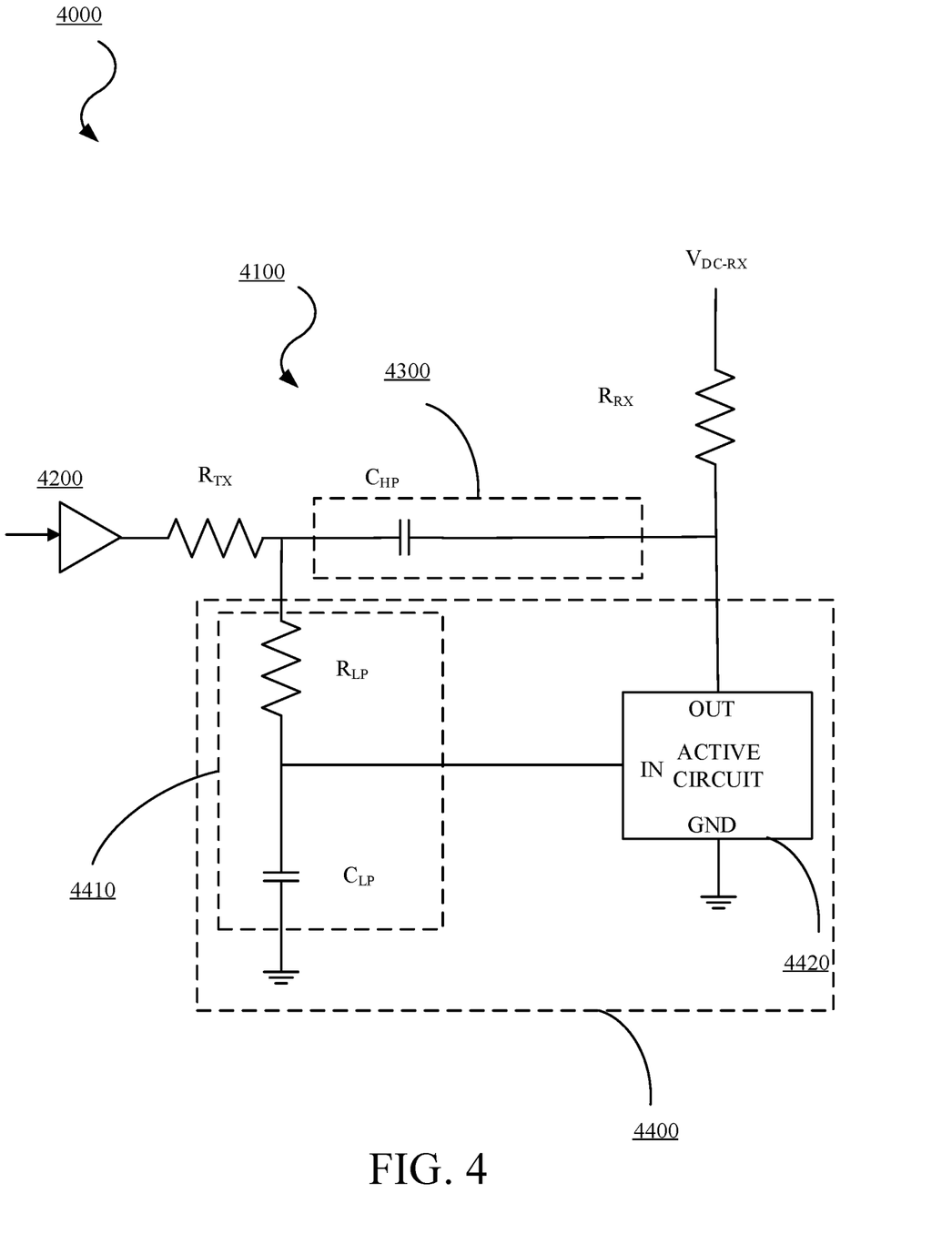
FIG. 4 is a block diagram of a single-ended broadband active coupling circuit in accordance with embodiments of this disclosure.

FIG. 4 is a block diagram of a system 4000 which includes a single-ended broadband active coupling circuit 4100 in accordance with embodiments of this disclosure. The single-ended broadband active coupling circuit 4100 is an implementation of the broadband active coupling circuit 2400 of FIG. 2. The system 4000 can include a transmitter 4200 which outputs a broadband signal, via a resistor $R_{TX}$, to the single-ended broadband active coupling circuit 4100. The single-ended broadband active coupling circuit 4100 is a two-channel coupling circuit which includes a high-pass channel 4300 and a low-pass channel 4400. For example, the high-pass channel 4300 can be a capacitor $C_{HP}$.

The low-pass channel 4400 can include a low pass filter 4410 and an active circuit 4420. The low pass filter 4410 can, in part, control a low-pass channel frequency and phase response and an overall TX-RX transfer function. The low pass filter 4410 can be a RC circuit which includes a resistor $R_{LP}$ connected to a capacitor $C_{LP}$, which has another end connected to ground. The other end of the resistor $R_{LP}$ is connected to the resistor $R_{TX}$. An input of the active circuit 4420 is connected to a middle tap point between the resistor $R_{LP}$ and the capacitor $C_{LP}$. An output of the active circuit 4420 is connected to one end of a resistor $R_{RX}$. That is, an output of the high-pass channel 4300 and the low-pass channel 4400 is combined to form a transmitter component output. A remaining end of the resistor $R_{RX}$ is connected to a DC voltage source $V_{DC\text{-}RX}$. The value of $R_{RX}$ is typically selected to match transmission line characteristic impedance, for example, 50 Ohms.

Figure 5:
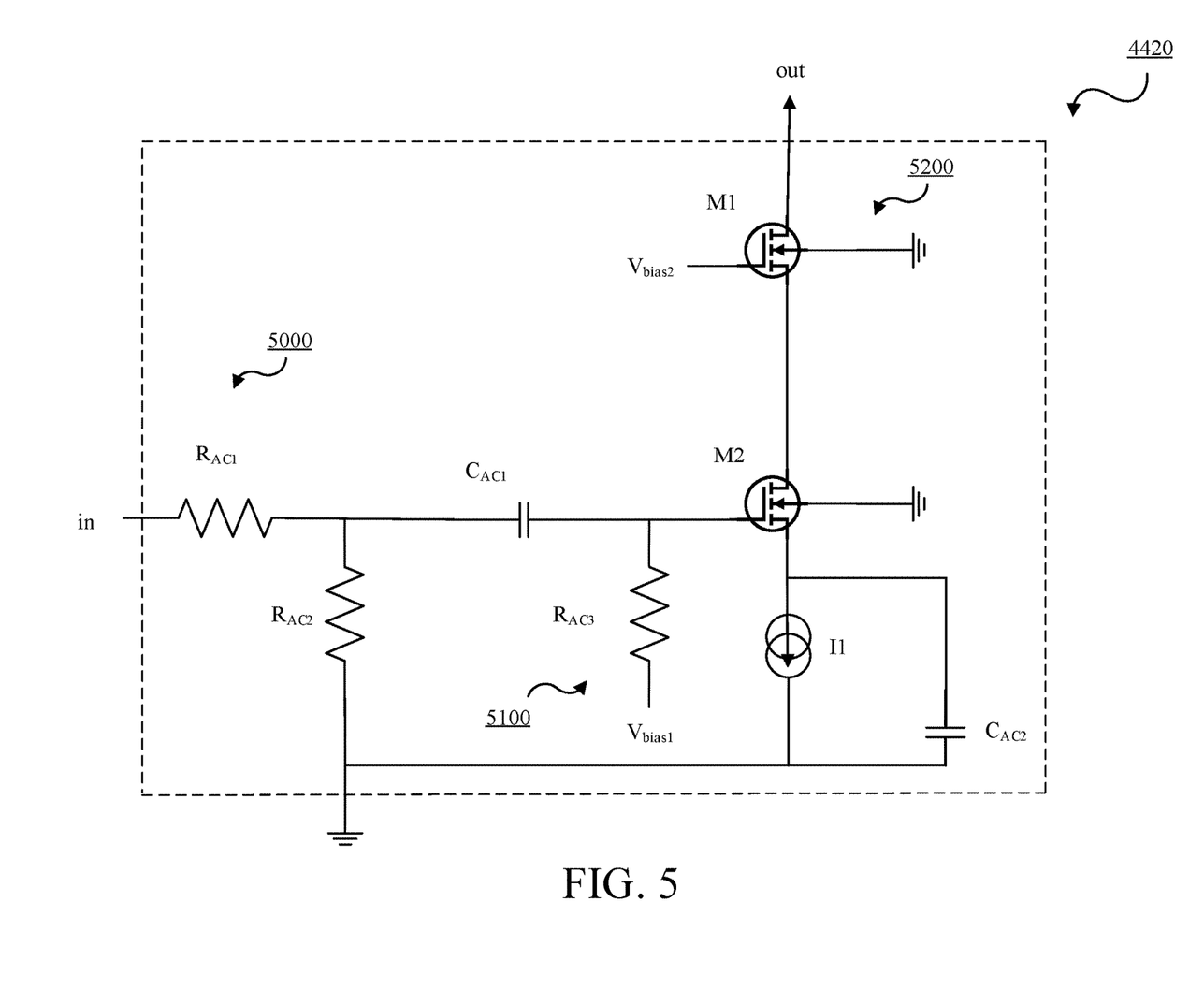
FIG. 5 is a block diagram of an active circuit in the single-ended broadband active coupling circuit of FIG. 4 in accordance with embodiments of this disclosure.

FIG. 5 is a block diagram of the active circuit 4420 of FIG. 4 in accordance with embodiments of this disclosure. Referring now to both FIG. 4 and FIG. 5, as appropriate, in this implementation, the active circuit 4420 is AC coupled to simplify DC bias conditions. As mentioned, the active circuit 4420 can provide minimum distortion with respect to high-pass frequencies, can limit or minimize amplitude and phase variation in the low-pass channel and in a transition frequency region between the high-pass channel and the low-pass channel, not impact a high-pass frequency corner, and not impact capacitor value selection of the high-pass channel. This can be achieved by using a combination of a low pass gain control circuit 5000, a high resistivity bias network 5100, and an isolation stage 5200.

The active circuit 4420 includes a resistor $R_{AC1}$ connected to the middle tap point between the resistor $R_{LP}$ and the capacitor $C_{LP}$. A remaining end of the resistor $R_{AC1}$ is connected to a resistor $R_{AC1}$ (which has a remaining end connected to ground) and a capacitor $C_{AC1}$. The resistor $R_{AC1}$ and the resistor $R_{AC2}$ constitute the low pass gain control circuit 5000.

A remaining end of the capacitor $C_{AC1}$ is connected to a resistor $R_{AC3}$ and a gate of a transistor M2. A remaining end of the resistor $R_{AC3}$ is connected to a DC voltage source $V_{bias1}$. The resistor $R_{AC3}$ and DC voltage source $V_{bias1}$ constitute the high resistivity bias network 5100 and provide bias independent of the driver or source 4200.

A source of the transistor M2 is connected to a DC current source I1 (which is connected to ground) and a capacitor $C_{AC2}$ tied to ground. A drain of the transistor M2 is connected to a source of a transistor M1, which has a drain providing an output for the active circuit 4420 and a gate connected to a DC voltage source $V_{bias2}$. The transistor M1 constitutes the isolation stage 5200.

Figure 6:
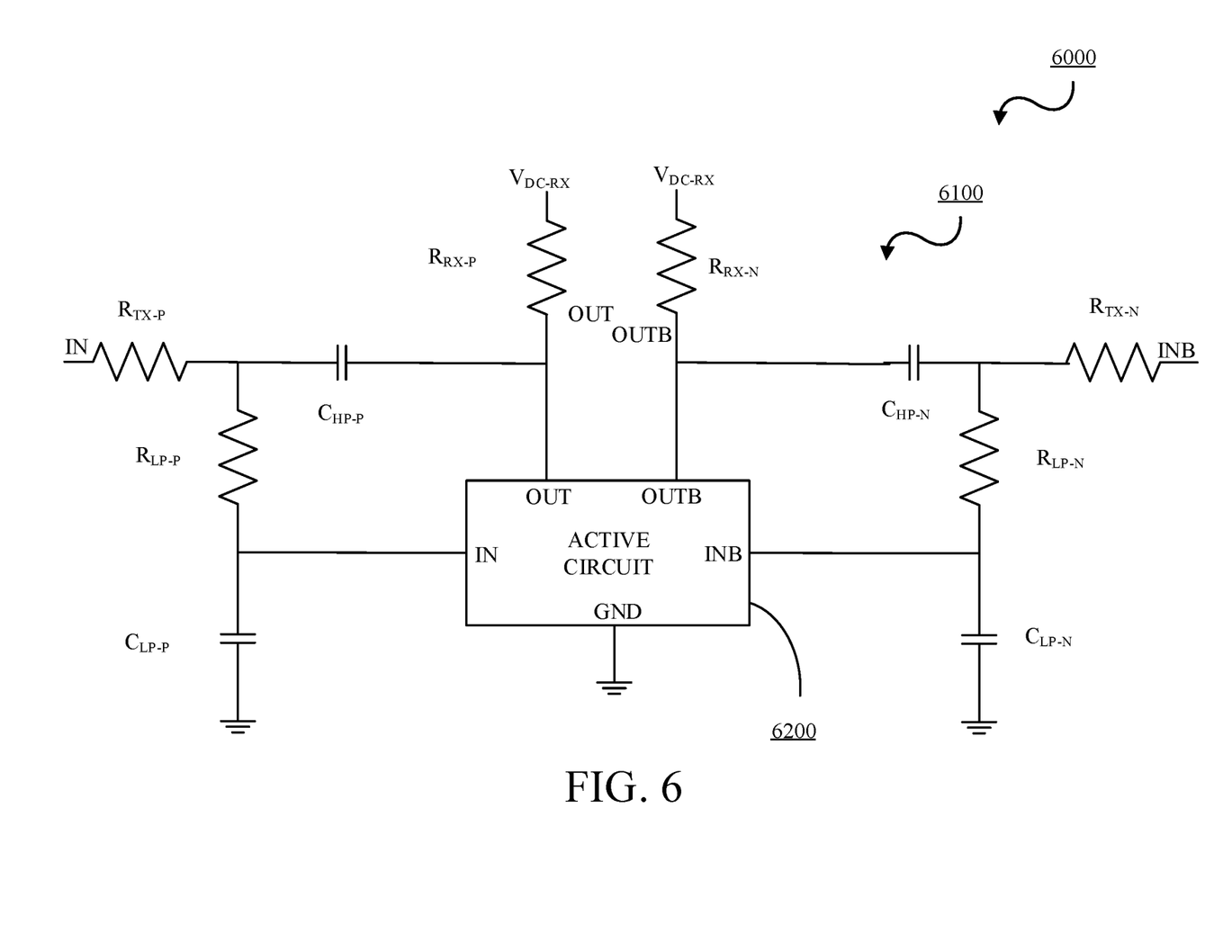
FIG. 6 is a block diagram of an AC coupled differential broadband active coupling circuit in accordance with embodiments of this disclosure.

FIG. 6 is a block diagram of an AC coupled differential broadband active coupling circuit 6000 in accordance with embodiments of this disclosure. The AC coupled differential broadband active coupling circuit 6000 includes a differential signal processing circuit 6100 and an AC coupled active circuit 6200. The AC coupled differential broadband active coupling circuit 6000 is a differential version of the single-ended broadband active coupling circuit 4100.

The differential signal processing circuit 6100 includes for a non-inverted input IN, a resistor $R_{TX-P}$ connected to a resistor $R_{LP-P}$ and a capacitor $C_{HP-P}$. A remaining end of the resistor $R_{LP-P}$ is connected to a capacitor $C_{LP-P}$, which is tied to ground. The resistor $R_{LP-P}$ and capacitor $C_{LP-P}$ constitute the low pass filter of the low pass channel for the non-inverted input IN as described herein. A middle tap point between the resistor $R_{LP-P}$ and capacitor $C_{LP-P}$ is connected to a non-inverted input of the active circuit 6200. A remaining end of the capacitor $C_{HP-P}$ is connected to a resistor $R_{RX-P}$. A non-inverted output of the active circuit 6200 is connected to a resistor $R_{RX-P}$. The non-inverted outputs of the high-pass channel and the low-pass channel are combined as described herein to generate a non-inverted output OUT.

Similarly, for the inverted input INB, the differential signal processing circuit 6100 includes for the inverted input INB, a resistor $R_{TX-N}$ connected to a resistor $R_{LP-N}$ and a capacitor $C_{HP-N}$. A remaining end of the resistor $R_{LP-N}$ is connected to a capacitor $C_{LP-N}$, which is tied to ground. The resistor $R_{LP-N}$ and capacitor $C_{LP-N}$ constitute the low pass filter of the low pass channel for the inverted input INB as described herein. A middle tap point between the resistor $R_{LP-N}$ and the capacitor $C_{LP-N}$ is connected to an inverted input of the active circuit 6200. A remaining end of the capacitor $C_{HP-N}$ is connected to a resistor $R_{RX-N}$. An inverted output of the active circuit 6200 is connected to a resistor $R_{RX-N}$. The inverted outputs of the high-pass channel and the low-pass channel are combined as described herein to generate an inverted output OUTB.

Figure 7:
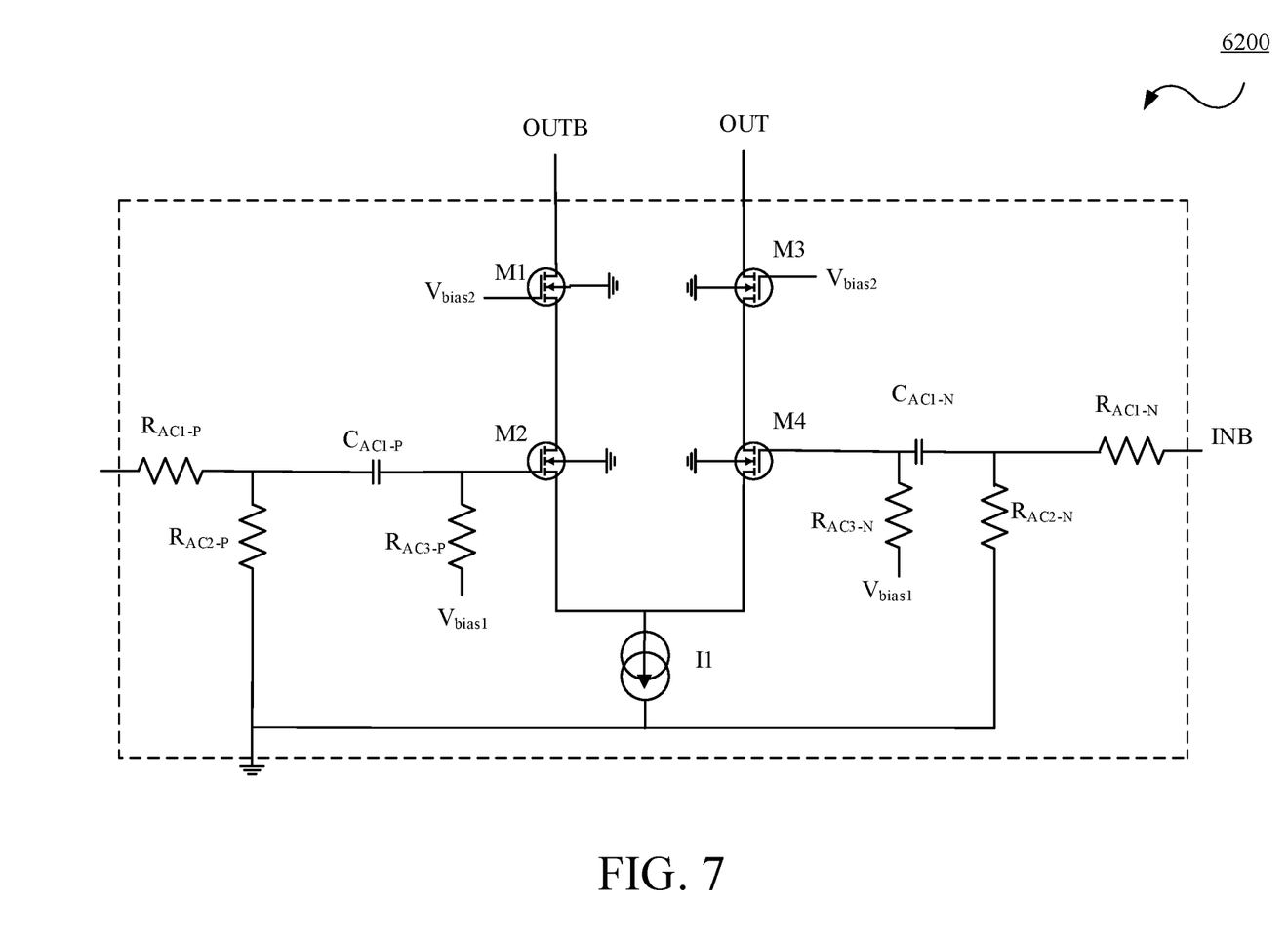
FIG. 7 is a block diagram of an active circuit in the differential broadband active coupling circuit of FIG. 6 in accordance with embodiments of this disclosure.

FIG. 7 is a block diagram of the AC coupled active circuit 6200 in the differential broadband active coupling circuit 6100 in accordance with embodiments of this disclosure. The active circuit 6200 is a differential version of the functionality described herein for FIG. 5.

For the non-inverted input IN, the active circuit includes a resistor $R_{AC1-P}$ connected to the middle tap point between the resistor $R_{LP-P}$ and the capacitor $C_{LP-P}$. A remaining end of the resistor $R_{AC1-P}$ is connected to a resistor $R_{AC2-P}$ (which has a remaining end connected to ground) and a capacitor $C_{AC1-P}$. The resistor $R_{AC1-P}$ and the resistor $R_{AC2-P}$ constitute the low pass gain control circuit as described herein. Transistor pairs M1/M3 and M2/M4 are the same type of transistor and similarly used transistors are meant to be connected in the same fashion. For example, transistors M1 and M3 are of the same type and are meant to be connected in the same fashion although the $V_{bias2}$ connections, for example, as shown are not identical.

A remaining end of the capacitor $C_{AC1-P}$ is connected to a resistor $R_{AC3-P}$ and a gate of a transistor M2. A remaining end of the resistor $R_{AC3-P}$ is connected to a DC voltage source $V_{bias1}$. The resistor $R_{AC3-P}$ and DC voltage source $V_{bias1}$ constitute the high resistivity bias network and provide bias independent of the driver or source as described herein.

A source of the transistor M2 is connected to a DC current source I1 (which is connected to ground). A drain of the transistor M2 is connected to a source of a transistor M1, which has a drain providing a non-inverted output OUT for the active circuit 6310 and a gate connected to a DC voltage source $V_{bias2}$ tied to ground. The transistor M1 constitutes the isolation stage as described herein.

Similarly, for the inverted input INB, the active circuit includes a resistor $R_{AC1-N}$ connected to the middle tap point between the resistor $R_{LP-N}$ and the capacitor $C_{LP-N}$. A remaining end of the resistor $R_{AC1-N}$ is connected to a resistor $R_{AC2-N}$ (which has a remaining end connected to ground) and a capacitor $C_{AC1-N}$. The resistor $R_{AC1-N}$ and the resistor $R_{AC2-N}$ constitute the low pass gain control circuit as described herein.

A remaining end of the capacitor $C_{AC1-N}$ is connected to a resistor $R_{AC3-N}$ and a gate of a transistor M4. A remaining end of the resistor $R_{AC3-N}$ is connected to a DC voltage source $V_{bias1}$. The resistor $R_{AC3-N}$ and DC voltage source $V_{bias1}$ constitute the high resistivity bias network and provide bias independent of the driver or source as described herein.

A source of the transistor M4 is connected to the DC current source I1 (which is connected to ground). A drain of the transistor M4 is connected to a source of a transistor M3, which has a drain providing an inverted output OUTB for the active circuit 6310 and a gate connected to a DC voltage source $V_{bias2}$. The transistor M3 constitutes the isolation stage as described herein.

Figure 8:
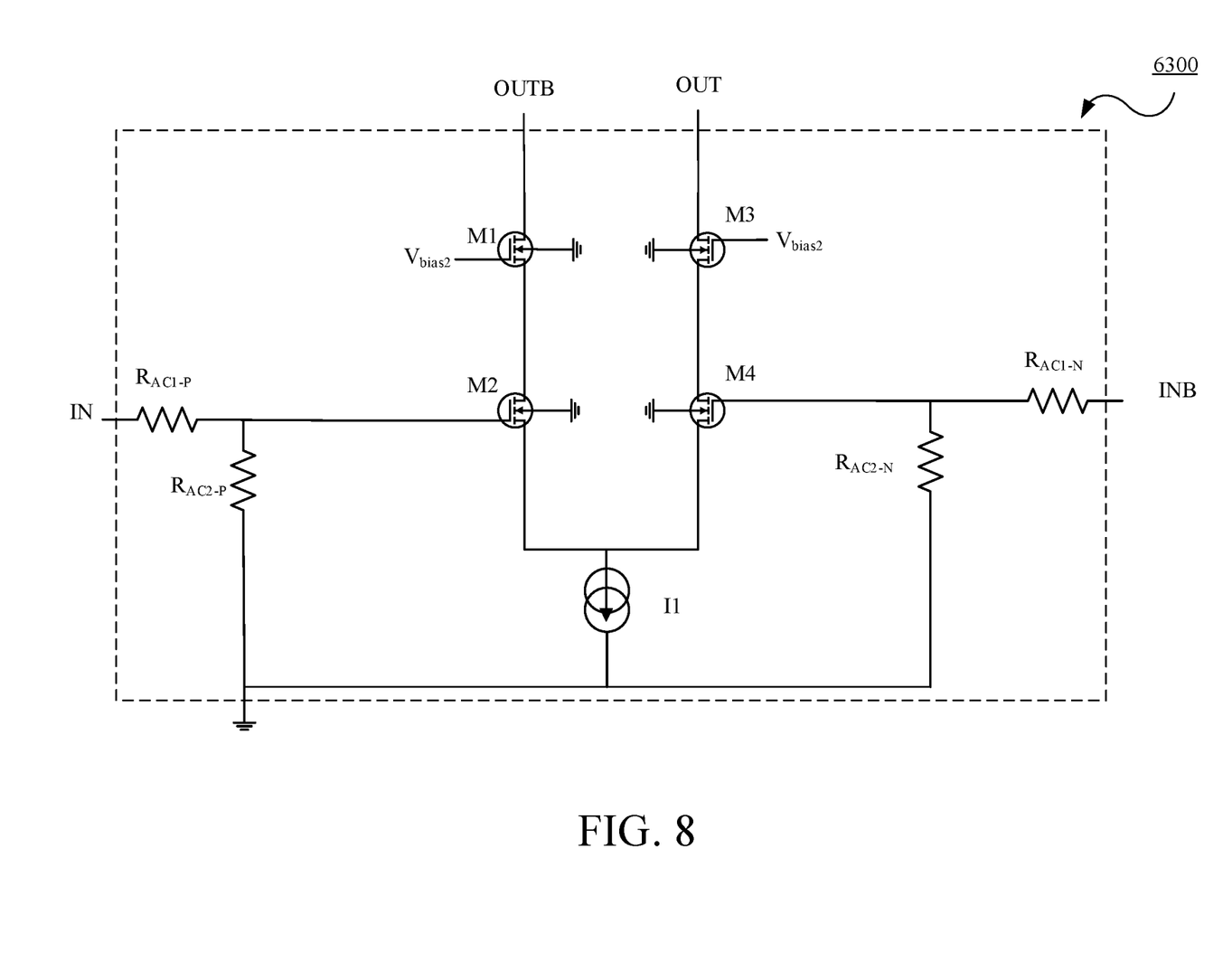
FIG. 8 is a block diagram of a DC coupled active circuit in the differential broadband active coupler of FIG. 6 in accordance with embodiments of this disclosure.

FIG. 8 is a block diagram of a DC coupled active circuit 6300 in the differential broadband active coupling circuit 6100 of FIG. 6 in accordance with embodiments of this disclosure. In this instance, a high-pass corner frequency can be extended to DC or zero hertz without impacting a high-pass channel frequency response (which can, for example, be up to 100 GHz).

For the non-inverted input IN, the active circuit includes a resistor $R_{AC1-P}$ connected to the middle tap point between the resistor $R_{LP-P}$ and the capacitor $C_{LP-P}$. A remaining end of the resistor $R_{LP-P}$ is connected to a resistor $R_{AC2-P}$ (which has a remaining end connected to ground) and a gate of a transistor M2. A source of the transistor M2 is connected to a DC current source I1 (which is connected to ground). A drain of the transistor M2 is connected to a source of a transistor M1, which has a drain providing a non-inverted output OUT for the active circuit 6300 and a gate connected to a DC voltage source $V_{bias2}$. The transistor M1 constitutes the isolation stage as described herein.

Similarly, for the inverted input INB, the active circuit includes a resistor $R_{AC1-N}$ connected to the middle tap point between the resistor $R_{LP-N}$ and the capacitor $C_{LP-N}$. A remaining end of the resistor $R_{AC1-N}$ is connected to a resistor $R_{AC2-N}$ (which has a remaining end connected to ground) and a gate of a transistor M4. A source of the transistor M4 is connected to the DC current source I1 (which is connected to ground). A drain of the transistor M4 is connected to a source of a transistor M3, which has a drain providing an inverted output OUTB for the active circuit 6300 and a gate connected to a DC voltage source $V_{bias2}$. The transistor M3 constitutes the isolation stage as described herein.

Figure 9:
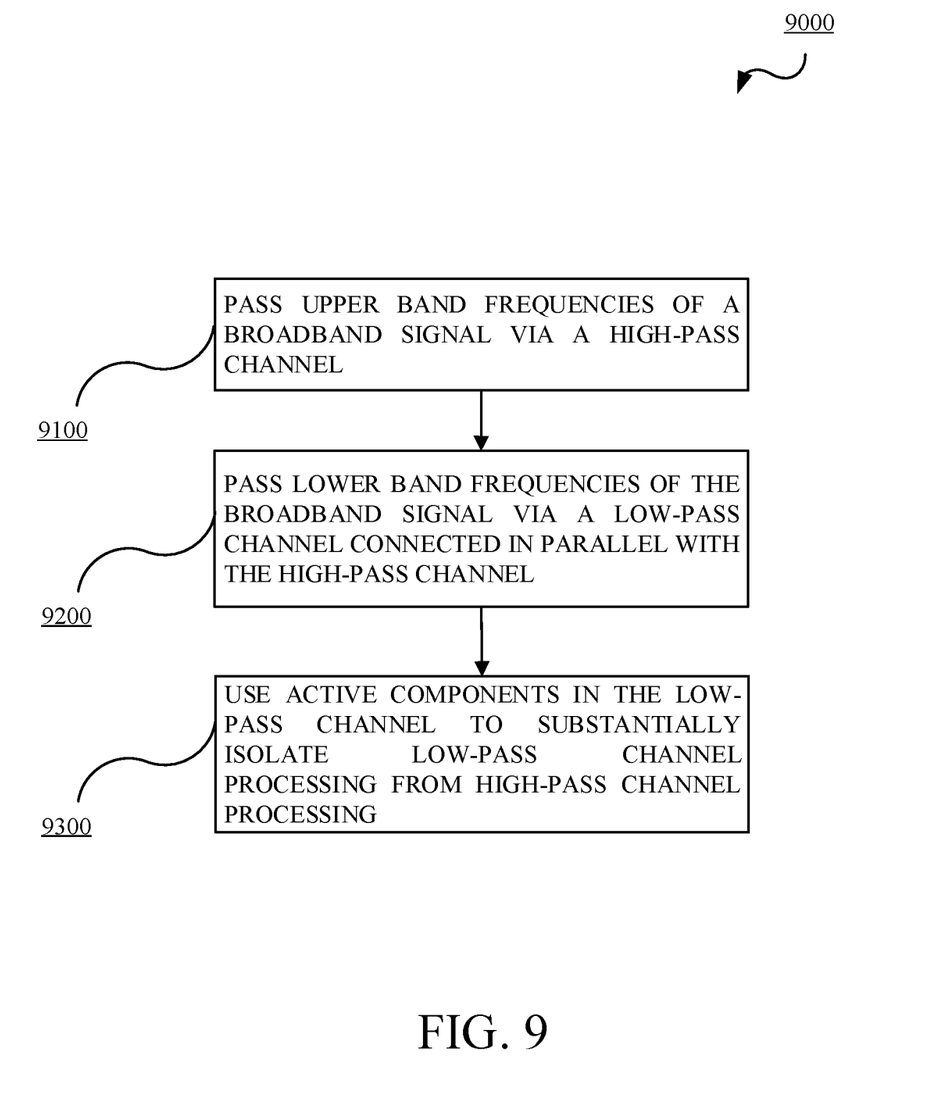
FIG. 9 is a flowchart of an example technique for broadband active coupling in accordance with embodiments of this disclosure.

FIG. 9 is a flowchart of an example technique 9000 for broadband active coupling in accordance with embodiments of this disclosure. The method 9000 includes: passing 9100 upper band frequencies of a broadband signal via a high-pass channel; passing 9200 lower band frequencies of the broadband signal via a low-pass channel connected in parallel with the high-pass channel; and using 9300 active components in the low-pass channel to substantially isolate low-pass channel processing from high-pass channel processing. The method 9000 can be implemented by the system 2000, the broadband active coupling circuit 2400, the system 4000, the single-ended broadband active coupling circuit 4100, the active circuit 4420, the system 6000, the AC coupled differential broadband active coupling circuit 6100, the AC coupled active circuit 6310, and the DC coupled active circuit 6310, as appropriate and applicable.

The method 9000 includes passing 9100 upper band frequencies of a broadband signal via a high-pass channel. A broadband active coupling device can be used to interface between a transmitter and receiver, where the transmitter and receiver can be based or implemented using different IC technologies. Optical communications have broad frequency ranges which can be detrimentally affected by using AC coupling circuits which are not able to pass lower end frequencies such as in the 1 MHz to DC range. The broadband active coupling device can have two channels so as to provide passing of a broad frequency range, from substantially DC or zero hertz to hundreds of GHz. The two channels can include a high-pass channel or upper band channel which is focused on passing frequencies from a first corner frequency and up to the hundreds of GHz range.

The method 9000 includes passing 9200 lower band frequencies of the broadband signal via a low-pass channel connected in parallel with the high-pass channel. The two channels can also include a low-pass channel or lower band channel which is focused on passing frequencies from or near the first corner frequency and down to substantially the DC range.

The method 9000 includes using 9300 active components in the low-pass channel to substantially isolate low-pass channel processing from high-pass channel processing. To minimize the impact of the low-pass channel processing on the high-pass channel processing, the low-pass channel includes a low pass filter to filter frequency and phase response of the low-pass channel and active circuitry to control amplitude gain and phase and provide circuit isolation.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A broadband active coupling circuit comprising:
    a high-pass circuit configured to provide a high frequency response for a broadband signal; and
    a low-pass circuit connected in parallel with the high-pass circuit, the low-pass circuit configured to provide a low frequency response for the broadband signal,
    wherein the low-pass circuit includes an active circuit configured to not impact the high frequency response provided by the high-pass circuit.

2. The broadband active coupling circuit of claim 1, wherein the high-pass circuit further comprising a capacitor selected to match a given integrated circuit (IC) technology to provide the high frequency response.

3. The broadband active coupling circuit of claim 1, wherein the low frequency response can range from a first frequency which is at or near a frequency of the high frequency response to a second frequency, where the second frequency is less than the first frequency.

4. The broadband active coupling circuit of claim 3, wherein the second frequency is at or near zero hertz.

5. The broadband active coupling circuit of claim 1, wherein the low-pass circuit further comprising a resistor-capacitor circuit coupled to the active circuit, the resistor-capacitor circuit configured to receive the broadband signal, wherein the active circuit and the resistor-capacitor circuit are configured to control the low frequency response frequency and phase response and broadband active coupler transfer function.

6. The broadband active coupling circuit of claim 1, wherein the broadband active coupling circuit is a single-ended broadband active coupling circuit.

7. The broadband active coupling circuit of claim 1, wherein the active circuit is a voltage-to-current circuit.

8. The broadband active coupling circuit of claim 1, wherein the active circuit further comprising a low pass gain control circuit and an isolation circuit configured to provide minimum distortion with respect to the high frequency response and limit amplitude and phase variation in a transition frequency region between the low frequency response and the high frequency response.

9. The broadband active coupling circuit of claim 1, wherein the broadband active coupling circuit is a differential broadband active coupling circuit.

10. The broadband active coupling circuit of claim 9, wherein the differential broadband active coupling circuit is a direct current coupled differential circuit.

11. A method for broadband active coupling, the method comprising:
    passing, from a transmitter to a receiver via a high-pass channel, upper band frequencies of a broadband signal, the upper band frequencies starting from a first high-pass corner frequency up to higher frequencies; and
    passing, from the transmitter to the receiver via a low-pass channel provided in parallel to the high-pass channel, lower band frequencies of the broadband signal, the lower band frequencies starting at or near the first high-pass corner frequency down to a second high-pass corner frequency,
    wherein the low-pass channel includes active components configured to isolate processing by the low-pass channel on the high-pass channel.

12. The method of claim 11, further comprising
    selecting capacitor values for the high-pass channel to accommodate integrated circuit technologies used for the transmitter and the receiver.

13. The method of claim 11, wherein the second high-pass corner frequency is at or near zero hertz.

14. The method of claim 11, further comprising
    generating from the broadband signal a differential input pair; and
    outputting by the low-pass channel a differential output pair.

15. The method of claim 11, further comprising
controlling, by the active components, an amplitude and phase variation in the low-pass channel and in a transition frequency region between the high-pass channel and the low-pass channel.

16. A system comprising:
a transmitter circuit configured to transmit a broadband signal;
a receiver circuit configured to receive the broadband signal via a transmission line; and
a two-channel coupling circuit configured to interface between the transmitter circuit and the receiver circuit, the two-channel coupling circuit comprising
an upper band channel configured to pass frequencies from the broadband signal starting from an upper band corner frequency up to higher frequencies; and
a lower band channel connected in parallel to the upper band channel, the lower band channel configured to pass frequencies starting at or near the upper band corner frequency down to a lower band corner frequency,
wherein the lower band channel includes active circuitry configured to mitigate impact on passing of the frequencies by the upper band channel.

17. The system of claim 16, wherein the upper band channel includes a capacitor selected to match a given integrated circuit.

18. The system of claim 16, wherein the lower band corner frequency is at or near zero hertz.

19. The system of claim 16, wherein the two-channel coupling circuit is a differential two-channel coupling circuit.

20. The system of claim 16, wherein the two-channel coupling circuit is a direct current coupled differential two-channel coupling circuit.

* * * * *